United States Patent
Vervoordeldonk et al.

(10) Patent No.: US 10,345,723 B2
(45) Date of Patent: Jul. 9, 2019

(54) SUBSTRATE HANDLING SYSTEM AND LITHOGRAPHIC APPARATUS

(71) Applicant: ASML NETHERLANDS B.V., Veldhoven (NL)

(72) Inventors: Michael Johannes Vervoordeldonk, Rosmalen (NL); Joeri Lof, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/072,218

(22) PCT Filed: Feb. 9, 2017

(86) PCT No.: PCT/EP2017/052806
§ 371 (c)(1),
(2) Date: Jul. 24, 2018

(87) PCT Pub. No.: WO2017/144277
PCT Pub. Date: Aug. 31, 2017

(65) Prior Publication Data
US 2019/0033733 A1 Jan. 31, 2019

(30) Foreign Application Priority Data

Feb. 24, 2016 (EP) .................................. 16157034

(51) Int. Cl.
*G03F 7/20* (2006.01)
*G03F 9/00* (2006.01)
*B65G 47/24* (2006.01)

(52) U.S. Cl.
CPC ............ *G03F 9/7011* (2013.01); *B65G 47/24* (2013.01); *G03F 7/7075* (2013.01);
(Continued)

(58) Field of Classification Search
CPC ............................ G03F 7/7075; G03F 9/7011
See application file for complete search history.

(56) References Cited

U.S. PATENT DOCUMENTS 4,457,664 A 7/1984 Judell et al.
4,775,877 A * 10/1988 Kosugi ............... G03F 7/70716
355/53

(Continued)

FOREIGN PATENT DOCUMENTS

CN 102736429 10/2012
EP 1197801 4/2002

OTHER PUBLICATIONS

International Search Report and Written opinion issued in corresponding PCT Application No. PCT/EP2017/052806, dated May 12, 2017, 9 Pages.

*Primary Examiner* — Steven Whitesell Gordon
(74) *Attorney, Agent, or Firm* — Pillsbury Winthrop Shaw Pitman LLP (57) ABSTRACT

A substrate handling system for handling a substrate, the substrate handling system including a holder for holding the substrate, a rotation device for rotating the holder around an axis perpendicular to a plane, and a mover for moving the holder along a path in the plane relative to the axis. Further, there is provided a lithographic apparatus including the substrate handling system. The substrate handling system may include a coupling device arranged to couple the holder to the mover or the rotation device in a first situation. The coupling device may be arranged to decouple the holder from the mover or rotation device in a second situation.

20 Claims, 4 Drawing Sheets (52) U.S. Cl.
CPC ...... *G03F 7/70258* (2013.01); *G03F 7/70733* (2013.01); *G03F 7/70741* (2013.01); *G03F 7/70875* (2013.01); *B65G 2203/042* (2013.01)

(56) References Cited

U.S. PATENT DOCUMENTS

| | | |
|---|---|---|
| 5,125,791 A | 6/1992 | Volovich |
| 5,448,332 A | 9/1995 | Sakakibara et al. |
| 6,370,793 B1 | 4/2002 | Chae et al. |
| 2002/0179585 A1 | 12/2002 | Maltabes et al. |
| 2003/0098664 A1* | 5/2003 | Watson .................. B23Q 1/623 318/649 |
| 2004/0118130 A1 | 6/2004 | Kuo |
| 2004/0227925 A1 | 11/2004 | Sato |
| 2010/0296070 A1 | 11/2010 | Shibazaki |
| 2013/0107236 A1 | 5/2013 | Westerlaken et al. |
| 2015/0070666 A1 | 3/2015 | Jacobs et al. |

\* cited by examiner

SUBSTRATE HANDLING SYSTEM AND LITHOGRAPHIC APPARATUS

CROSS REFERENCE TO RELATED APPLICATIONS

This application is the U.S. national phase entry of PCT patent application No. PCT/EP2017/052806, which was filed on Feb. 9, 2017, which claims the benefit of priority of European patent application No. 16157034.6, which was filed on Feb. 24, 2016, and which is incorporated herein in its entirety by reference.

BACKGROUND

Field of the Invention

The invention relates to a substrate handling system for handling a substrate and a lithographic apparatus.

Description of the Related Art

A lithographic apparatus is an apparatus that can be used in the manufacture of integrated circuits (ICs). In that instance, a patterning device, which is alternatively referred to as a mask or a reticle, may be used to generate a circuit pattern to be formed on an individual layer of the IC. This pattern can be transferred by a radiation beam via a projection system onto a target portion on a substrate, such as a silicon wafer. Transfer of the pattern is typically via imaging onto a layer of radiation-sensitive material provided on the substrate. In general, a single substrate will contain a network of adjacent target portions that are successively patterned. Known lithographic apparatus include so-called steppers, in which each target portion is irradiated by exposing an entire pattern onto the target portion at one time. Known lithographic apparatus also include so-called scanners, in which each target portion is irradiated by scanning the pattern through a radiation beam in a given direction while synchronously scanning the substrate parallel or anti parallel to this direction.

The lithographic apparatus typically is provided with a substrate handling system. The substrate handling system is arranged to receive a substrate from outside the lithographic apparatus and transfer the substrate further into the lithographic apparatus. In some applications, the substrate handling system is arranged to receive a substrate from one part of the lithographic apparatus and to transfer the substrate to another part of the lithographic apparatus. The substrate handling system typically has two functions. The first function is to align the substrate with a reference, so the position and orientation of the substrate is within a certain desired range. This alignment function is also known as pre-alignment. The other function typically is to thermally condition the substrate.

A known substrate handling system is disclosed in U.S. patent application no. US 2015/0070666 A1, hereby incorporated by reference. The known substrate handling system has a thermal conditioning system that holds a substrate and provides a heat transfer between the substrate and the thermal conditioning system. The known substrate handling system further has a substrate position manipulator for rotating the substrate during pre-alignment.

SUMMARY OF THE INVENTION

A disadvantage of the known substrate handling system is that the thermal conditioning is limited during pre-aligning. During pre-aligning, the wafer is moved in a horizontal plane (x) and rotated around an axis perpendicular to the horizontal plane (Rz). In the known substrate handling system, rotating the substrate in Rz is done in one of two ways. In the first way, a gas film is provided between the substrate and the thermal conditioning device. A gas film is not as effective in exchanging heat with the substrate as physical contact would be. In the second way, the physical contact is made. However, when the substrate is to be rotated or moved, the substrate first needs to be lifted from the thermal conditioning device, which negatively affects the thermal conditioning of the substrate.

It is an objection of the invention to provide substrate handling system that provides an improved thermal conditioning of the substrate.

In a first aspect of the invention, there is provided a substrate handling system comprising a holder for holding the substrate;

a rotation device for rotating the holder around an axis perpendicular to a plane; and a mover for moving the holder along a path in the plane relative to the axis.

In a second aspect of the invention, there is provided a lithographic apparatus comprising the substrate handling system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
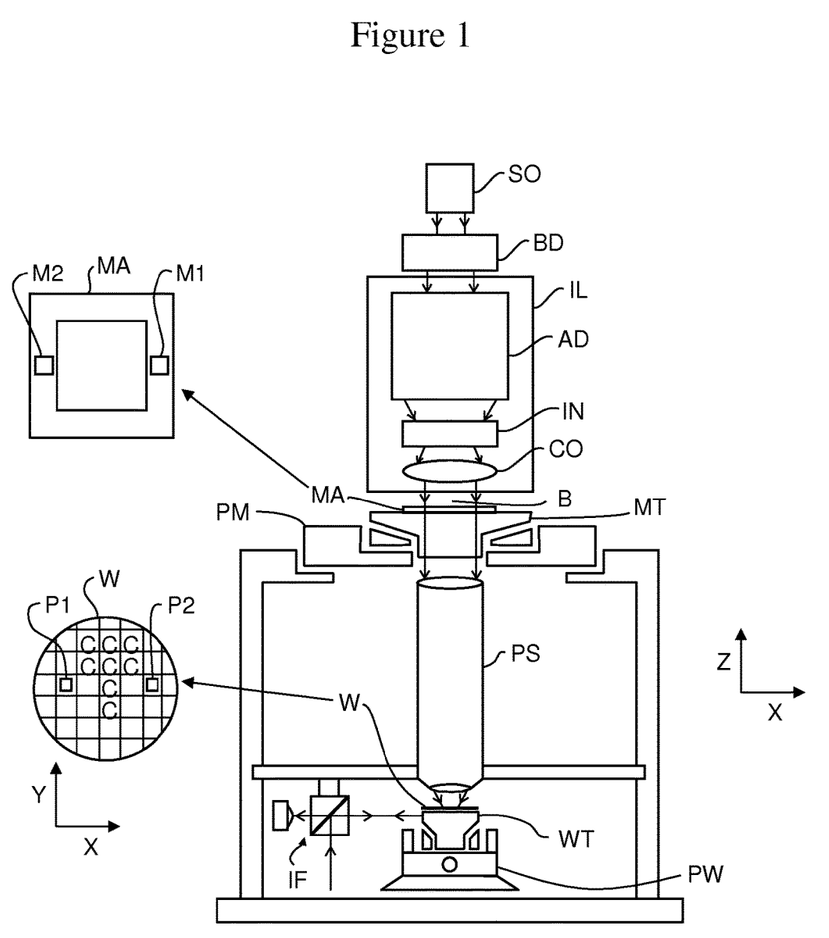
FIG. 1 depicts a lithographic apparatus according to an embodiment of the invention.

FIG. 1 schematically depicts a lithographic apparatus comprising an illumination system IL, a support structure MT, a substrate table WT and a projection system PS.

The illumination system IL is configured to condition a radiation beam B. The illumination system IL may include various types of optical components, such as refractive, reflective, magnetic, electromagnetic, electrostatic or other types of optical components, or any combination thereof, for directing, shaping, or controlling radiation.

The illumination system IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. In addition, the illumination system IL may comprise various other components, such as an integrator IN and a condenser CO. The illumination system IL may be used to condition the radiation beam B, to have a desired uniformity and intensity distribution in its cross section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure (e.g. a mask table) MT is for supporting a patterning device (e.g. a mask or reticle) MA. The support structure MT is connected to a first positioning system PM configured to accurately position the patterning device MA in accordance with certain parameters.

The support structure MT supports, i.e. bears the weight of the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of a patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. As here depicted, the apparatus is of a transmissive type, which employs a transmissive mask.

The substrate table WT, e.g. a wafer table, is for holding a substrate W, e.g. a resist coated wafer. The substrate table WT is connected to a second positioning system PW configured to accurately position the substrate W in accordance with certain parameters.

The projection system PS is configured to project a pattern imparted to the radiation beam B by patterning device MA onto a target portion C of the substrate W.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The radiation beam B is incident on the patterning device MA, which is held on the support structure MT, and is patterned by the patterning device MA. Having traversed the patterning device MA, the radiation beam B passes through the projection system PS which focuses the radiation beam B onto a target portion C of the substrate W. With the aid of the second positioning system PW and position sensor IF (e.g. an interferometric device, linear encoder or capacitive sensor), the substrate table WT can be moved accurately, e.g. so as to position different target portions C in the path of the radiation beam B. Similarly, the first positioning system PM and another position sensor (which is not depicted in FIG. 1) can be used to accurately position the patterning device MA with respect to the path of the radiation beam B. In general, movement of the support structure MT may be realized with the aid of a long-stroke module and a short-stroke module. The long-stroke module provides coarse positioning of the short-stroke module relative to the projection system PS over a long range. The short-stroke module provides fine positioning of the patterning device MA relative to the long-stroke module over a small range. Similarly, movement of the substrate table WT may be realized using a long-stroke module and a short-stroke module, which form part of the second positioning system PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the mask alignment marks M1, M2 may be located between the dies.

The lithographic apparatus may be of a type having two or more substrate tables WT and/or two or support structures MT. In addition to the at least one substrate table WT, the lithographic apparatus may comprise a measurement table, which is arranged to perform measurements but is not arranged to hold a substrate.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The depicted lithographic apparatus could be used in at least one of the following three modes: In the first mode, the so-called step mode, the support structure MT and the substrate table WT are kept essentially stationary, while an entire pattern imparted to the radiation beam is projected onto a target portion C at one time. The substrate table WT is then shifted in the X and/or Y direction so that a different target portion C can be exposed.

In the second mode, the so-called scan mode, the patterning device MT and the substrate table WT are scanned synchronously while a pattern imparted to the radiation beam is projected onto a target portion C. The velocity and direction of the substrate table WT relative to the patterning device MT may be determined by the (de-)magnification and image reversal characteristics of the projection system PS.

In the third mode, the patterning device MA is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Figure 2A:
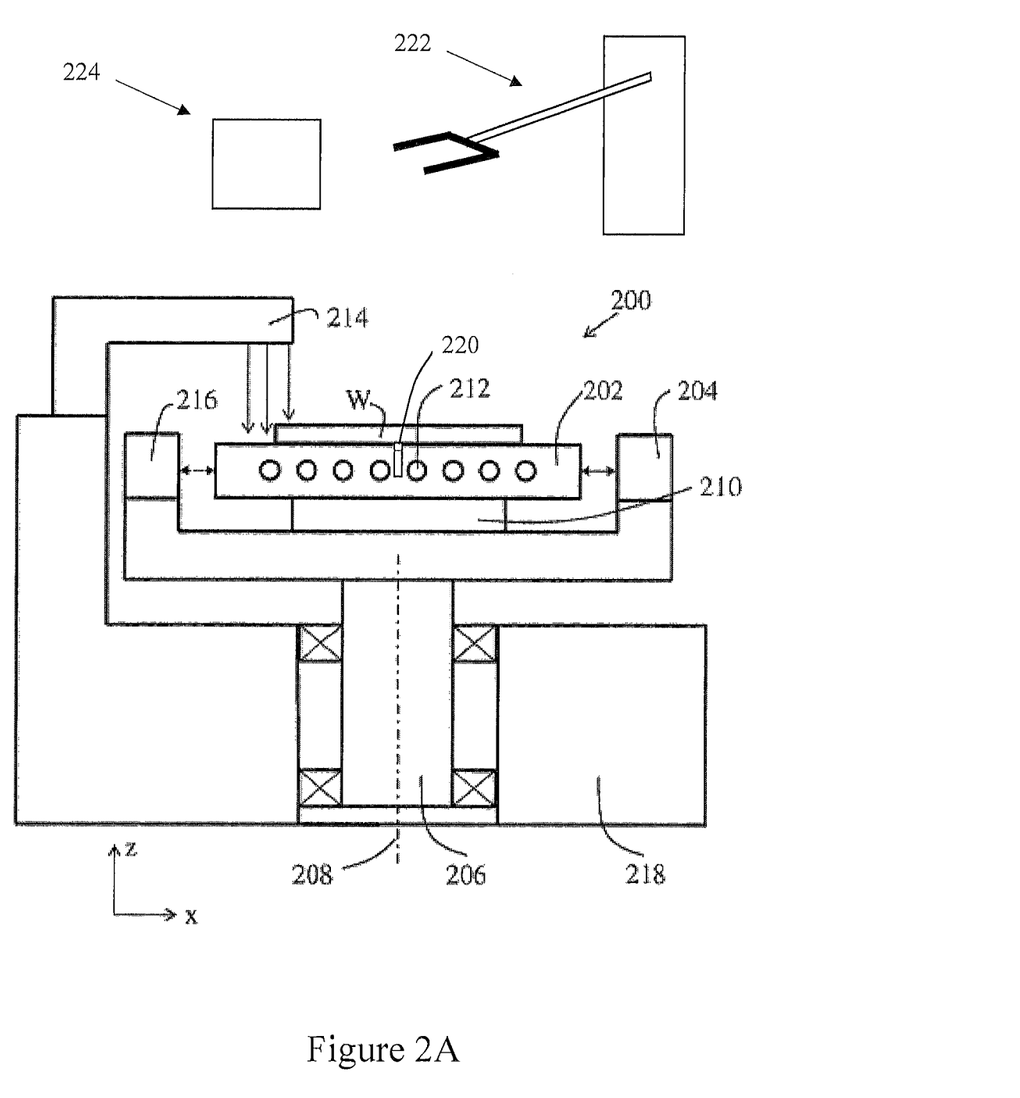
FIG. 2A depicts a substrate handling system according to an embodiment of the invention.
Figure 2B:
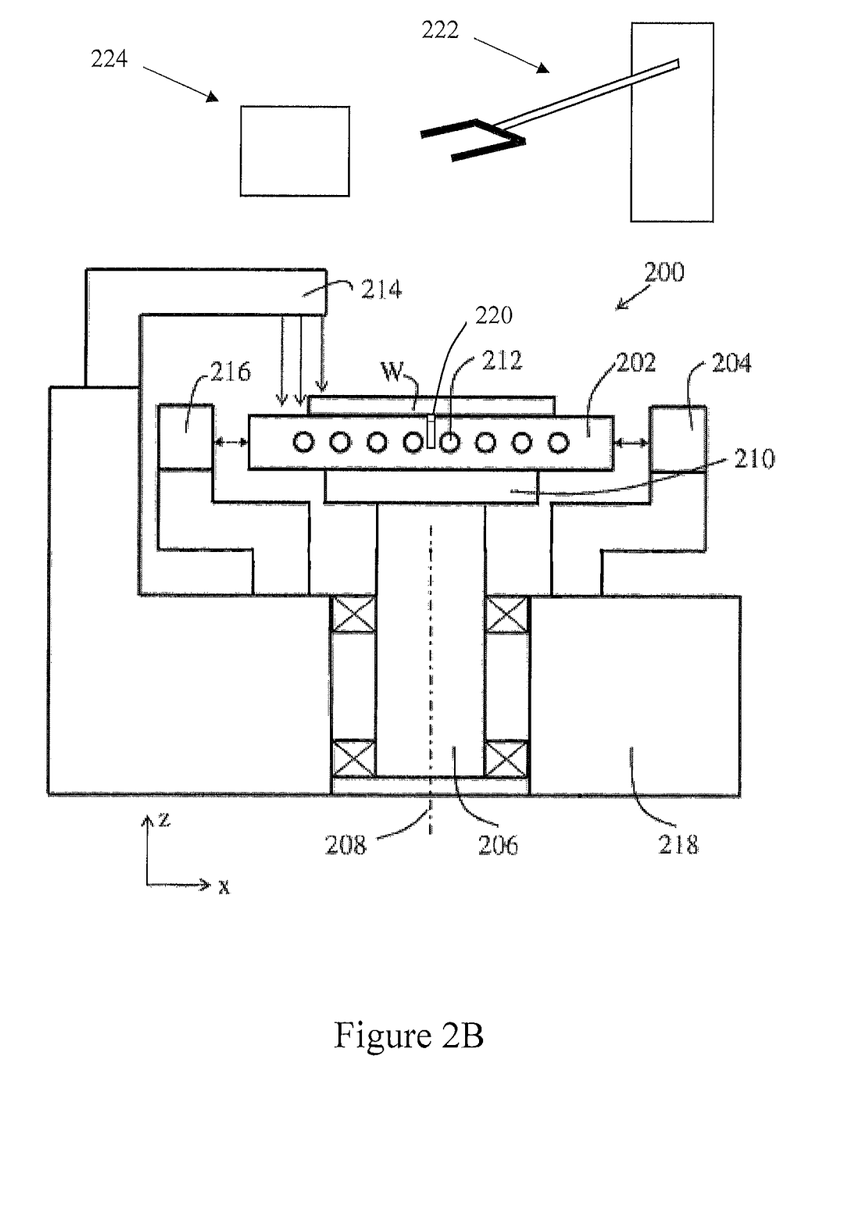
FIG. 2B depicts a substrate handling system according to an embodiment of the invention.

FIGS. 2A and 2B depict a substrate handling system 200 according to an embodiment of the invention. The substrate handling system 200 comprises a holder 202, a mover 204, a rotation device 206 and a coupling device 210. The holder 202 is for holding a substrate W. The mover 204 is for moving the holder 202 along a path in a plane. The rotation device 206 is arranged for rotating the holder 202 along an axis 208 perpendicular to the plane. The mover 204 is for moving the holder 202 along the path in the plane relative to the axis 208.

The coupling device 210 is arranged to couple the holder 202 to one of the mover 204 and the rotation device 206 in a first situation. The coupling device 210 is arranged to decouple the holder 202 from the one of the mover 204 and the rotation device 206 in a second situation. In the depicted embodiment of FIGS. 2A and 2B, the coupling device 210 is arranged to decouple the holder 202 from the rotation device 206 in a second situation.

The holder 202 may be provided with a clamping device for clamping the substrate W onto the holder 202. The clamping device may be arranged to make use of an under pressure or a vacuum to suck the substrate W onto the holder 202. The clamping device may have an electrostatic clamp to clamp the substrate W onto the holder 202. The holder 202 may have a plurality of protrusions on which the substrate W can be held.

The holder 202 may be provided with a thermal conditioning device 212 for conditioning a temperature of the substrate W. The substrate W is thermally connected to the thermal conditioning device 212. The thermal conditioning device 212 may be provided with channels arranged to have a fluid flowing through. The fluid has a certain temperature which is chosen so as to influence the temperature of the substrate W. The fluid may be a liquid, e.g, water, or may be a gas, e.g., helium, argon, or may be a combination of a liquid and a gas. Such a combination may comprise $CO_2$ at a certain pressure, e.g., 10 bar or 50 bar or 100 bar, so the operating temperature of the substrate handling system 200 is near the phase transition temperature of the $CO_2$. When the thermal conditioning device 212 transfers a heat load to the substrate W or receives a heat load from the substrate W, the temperature of the $CO_2$ remains the same, whereas the ratio between amount of gas and the amount of liquid changes. Instead of $CO_2$, any other type of 2 phase fluid may be used. In addition or alternatively, the thermal conditioning device 212 may comprise electrical components, such as Peltier elements and/or electrical heaters. The thermal conditioning device 212 may be arranged to condition the entire surface of the substrate W or the thermal conditioning device 212 may be arranged to condition a part of the surface of the substrate W. The thermal conditioning device 212 may be arranged to cool the substrate W, heat the substrate W or both cool and heat the substrate W.

The mover 204 is arranged to move the holder 202 along a path in a plane. In this embodiment, the plane is the xy-plane, which may be the horizontal plane. The path may be along one direction, for example the x-direction, or may be along two directions, e.g., x- and y-direction, or a combination thereof. The path may be along any direction in the xy-plane. Although FIGS. 2A and 2B indicate that the mover 204 is on the rotation device 206 only, part of the mover 204 may be attached to the holder 202. For example, the mover 204 may comprise a Lorentz actuator having a magnet and a coil. The magnet may be on one of the rotation device 206 and the holder 202. The coil may be on the other of the rotation device 206 and the holder 202. The mover 204 may comprise any suitable type of actuator to move the holder 202, for example a magnetic actuator, a pneumatic actuator or a piezo-actuator. In an embodiment, the mover 204 is connected to the rotation device 206 as shown in FIG. 2A. In another embodiment, the mover 204 is connected to another component other than the rotation device 206, for example a base 218 supporting the rotation device 206 as shown in FIG. 2B.

The rotation device 206 is arranged for rotating the holder 202 along the axis 208 perpendicular to the plane. The rotation device 206 may be arranged to rotate the holder 202 at least 60°, 120°, 180° or 360°. The rotation device 206 may be arranged to rotate the holder 202 over more than 360°, for example 370° or 380°.

Figure 3:
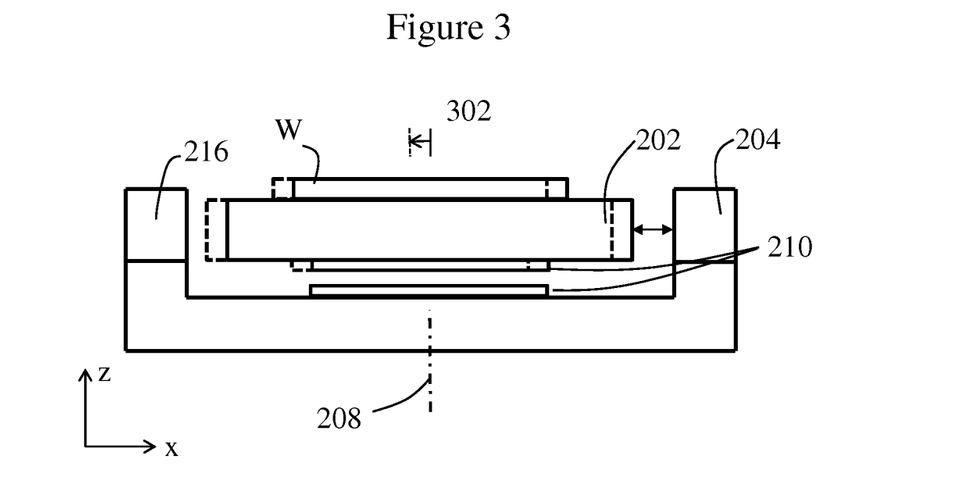
FIG. 3 depicts part of a substrate handling system according to a further embodiment of the invention.

In the embodiment of FIGS. 2A and 2B, the coupling device 210 is arranged to couple the holder 202 and the rotation device 206 to each other in the first situation. In the second situation, as shown in FIG. 3, the coupling device 210 is arranged to decouple the holder 202 from the rotation device 206. When in the second situation, the mover 204 can move the holder 202 along a path in the xy-plane relative to the axis 208. When the mover 204 moves the holder 202 relative to the axis 208, a position between the axis 208 and a center of the substrate W on the holder 202 changes.

The substrate handling system 200 may be provided with a sensor 214 to provide a signal representative of a position of the center of the substrate W relative to a reference element. The sensor 214 is arranged on base 218. The sensor 214 provides a measurement beam which covers part of the edge of the substrate W. After the measurement beam has interacted with the edge of the substrate W, the sensor 214 is arranged to receive the measurement beam. Based on the received measurement beam, the sensor 214 can provide a signal representative of the position of the edge of the substrate W. When the rotation device 206 rotates the substrate W during a measurement of the sensor 214, at least part of the total edge of the substrate W is measured by the sensor 214. Based on the measured position of at least part of the total edge, the center of the substrate W may be determined. In FIGS. 2A and 2B, only one sensor 214 is shown, but in an embodiment, a plurality of sensor 214 is provided, for example 2, 3 or 4 sensors 214. The sensor 214 may be an optical sensor that has a radiation source to provide a radiation beam onto the surface of the substrate W and has a detector to receive the radiation beam after interaction with the surface. The optical sensor may interact with the edge of the substrate W and/or with a marker on the surface of the substrate W. The optical sensor may comprise a CCD-chip or a CMOS-chip to capture an image of the substrate W. The sensor 214 may be any other type of suitable sensor arranged to detect the edge of the substrate W, such as a capacitive sensor, or an inductive sensor. The sensor 214 may provide a signal based on a mark on the substrate W. For example, the signal may represent a position of the mark.

The substrate handling system 200 may comprise a controller arranged to control a movement of the mover 204 and a rotation of the rotation device 206 based on the signal provided by the sensor 214. By using the signal from the sensor 214, the controller may calculate the calculated position of the center of the substrate W. The calculated position may be different from the desired position of the center of the substrate W. The controller may be arranged to determine an offset 302 between the calculated position and the desired position. To position the center of the substrate W to the desired position, the controller may first rotate the rotation device to a desired rotational position. During this rotation, the coupling device 210 may couple the holder 202 to the rotation device 206, so the holder 202 is rotated by the rotation device 206. When the desired rotational position is achieved, the coupling device 210 may decouple the holder 202 and the rotation device 206 from each other, as shown in FIG. 3. The controller may control the mover 204 to move the holder 202 along the path in the xy-plane to a desired position to minimize the offset 302. After moving the holder 202 with the mover 204, the coupling device 210 may couple the holder 202 and the rotation device 206 to each other again. The rotation device 206 may rotate the holder 202 and the sensor 214 may provide a new signal representative of the adjusted center of the substrate W. Based on the new signal, one or more of the following options may be selected. The first option is to repeat the method of rotating the substrate W to a desired rotational position, decouple the holder 202 from the rotation device 206, moving the holder 202 with the mover 204 to a desired position and couple the holder 202 to the rotation device 206. Using the first option would typically further reduce the offset 302. The second option is to use the new signal as information for the lithographic apparatus. With this information, the lithographic apparatus can determine the position of the substrate W and can adjust any process steps accordingly. The third option is to check whether the substrate W is positioned with a certain range. Depending on the outcome of the third option, the first option or the second option may be selected.

The controller may be arranged to determine the offset 302 relative to a reference. The reference may be the position of the sensor 214 or the axis 208. The reference may be a calibrated offset with respect to the sensor 214 or the axis 208.

A robot 222 may be arranged to load the substrate W onto the substrate handling system 200 and/or to unload the substrate W from the substrate handling system 200. Typically, such a robot is not accurate enough to transfer the substrate from the substrate handling system 200 to the substrate table WT while maintaining the desired maximum of offset 302.

Therefore, the substrate handling system 200 may comprise a docking device 224. Before the robot loads a substrate W onto the holder 202 or unloads a substrate W from the holder 202, the robot docks with the docking device. The docking device may act as the reference element, so the offset 302 is minimized with respect to the docking device. The robot may have an interface to interact with the docking device. The interface may be close to the part of the robot that holds the substrate W and so an accurate positional relationship can be achieved between the position of the substrate W held by the robot and the interface. In an embodiment, the robot is part of the substrate handling system 200. In addition or alternatively to the docking device, the substrate handling system 200 may be provided with a robot measurement system. The robot measurement system may provide an output representative of a position of the robot relative to the reference element. The output may be used by the controller to control the mover 204, the rotation device 206 and/or the coupling device 210. The robot measurement system may comprise a mark and a detector system. The mark may be on one of the robot and the substrate handling system 200. The detector system may be on the other of the robot and the substrate handling system 200. The detector system may provide the output, wherein the output is dependent on a position of the mark relative to the detector system.

The substrate handling system 200 may comprise a further sensor 216 for providing a sensor signal representative of a position of the mover 204 relative to the reference element. The controller may use the sensor signal from the further sensor 216 to control the mover 204. The further sensor 216 may comprise an encoder system, a capacitive sensor or any other suitable sensor. The further sensor 216 may comprise two parts, for example an encoder head and a scale. One part may be arranged on the mover 204. The other may be on another component other than the mover 204, such as the rotation device 206 or the base 218.

Figure 4:
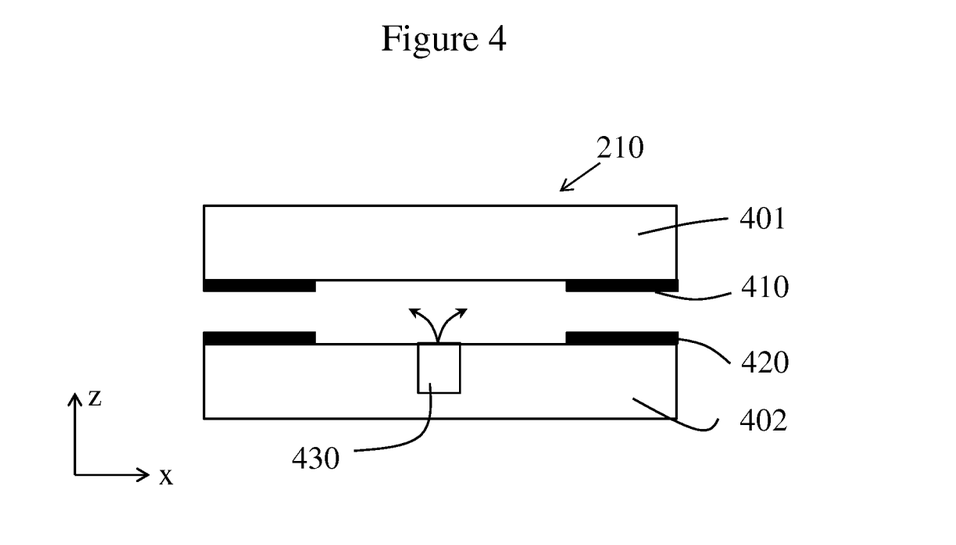
FIG. 4 depicts a detailed view of the substrate handling system according to an embodiment of the invention.

In an embodiment, in the first situation, the mover 204 is arranged to the move the holder 202 while moving the rotation device 206. In the second situation, the mover 204 is arranged to move the holder 202 without moving the rotation device 206. In another embodiment, in the first situation, the rotation device 206 is arranged to the rotate the holder 202 while rotating the mover 204. In the second situation, the rotation device 206 is arranged to rotate the holder 202 without rotating the mover 204. FIG. 4 shows a detailed view of the coupling device 210 according to an embodiment of the invention. The coupling device 210 comprises a first part 401, a second part 402 and an actuator. The first part 401 has a first contact area 410. The second part 402 has a second contact area 420. The coupling device 210 is arranged to couple the first contact area and the second contact area 420 in the first situation. The actuator is arranged to separate the first contact area 410 and the second contact area 420 in the second situation. In the first situation, the first contact area 410 and the second contact area 420 are clamped together, for example by gravity. An additional clamping force may be provided by a clamp to clamp the first contact area 410 and the second contact area 420 together. The clamp may comprise a magnet or a further actuator. The first contact area 410 and the second contact area 420 may have a high friction coefficient to prevent any slipping in the xy-plane in the first situation. The high friction coefficient may be created by providing a rough surface or by providing a high friction material.

The actuator may comprise a gas nozzle 430 arranged to provide a gas to separate the first contact area 410 and the second contact area 420 in the second situation. The gas nozzle 430 may create a gas bearing between the first part 401 and the second part 402, allowing the first part 401 and the second part 402 to move relative to each other in the xy-plane. The gas nozzle 430 may be any type of device suitable to provide a pressurized gas, and may comprise an outlet, a hose or a tube. Alternatively, the actuator may comprise a magnetic actuator, such as a Lorentz actuator, or may comprise a piezo-actuator or any other suitable actuator.

The coupling device 210 may comprise a flexible element that connects the first part 401 and the second part 402. The flexible element is flexible in a direction in the xy-plane. For example in the x-direction, the y-direction or both. The flexible element may be flexible in any direction in the xy-plane. The flexible element may be non-flexible for a rotation around the axis 208 to prevent that the first part 401 and the second part 402 rotate relative to each other around the axis 208. The flexible element may comprise two leaf springs, each of which is flexible in the x-direction and is non-flexible in the y-direction. The flexible element may comprise two further leaf springs, each of which is flexible in the y-direction and is non-flexible in the x-direction. The leaf springs and the further leaf springs may be connected to each other via an intermediate body. One of the two leaf springs may be connected to the first part 401, and one of the two further leaf springs may be connected to the second part 402.

The substrate handling system 200 may be provided with a lifting pin 220 arranged to lift the substrate W from the holder 202. The lifting pin comprises a flexible tip arranged to contact the substrate W. The flexible tip may be rotatably flexible along one or more axes in the xy-plane. The flexible tip may prevent a movement of the substrate W in the xy-plane caused by a tilt offset between the holder 202 and the lifting pin. In an embodiment, the flexible tip is rotatable around a center, wherein the z-position of the center is located in the substrate W, when the flexible tip supports a substrate W. The z-position of the center may be located under the substrate W, when the flexible tip supports a substrate W, for example 0.5 mm under the substrate W, or 1 mm or 2 mm.

The substrate handling system 200 may be an integrated unit in a lithographic apparatus.

The substrate handling system 200 may be used with other apparatus than lithographic apparatus. For example, the substrate handling system 200 may be used to transfer substrates from and to a coating apparatus for coating a substrate, a baking apparatus for baking a substrate at a high temperature, a cleaning apparatus for cleaning a substrate. The substrate handling system 200 may be used in a metrology tool arranged to measure a property of the substrate W. The property may be a position of a marker on the substrate W. The substrate handling system 200 may be an integrated part of such an apparatus or may be a separate but connected to such an apparatus.

In an embodiment, there is provided a substrate handling system for handling a substrate, the substrate handling system comprising: a holder for holding the substrate; a rotation device for rotating the holder around an axis perpendicular to a plane; a mover for moving the holder along a path in the plane relative to the axis.

In an embodiment, the substrate handling system comprises a coupling device arranged to couple the holder to one of the mover and the rotation device in a first situation, wherein the coupling device is arranged to decouple the holder from the one of the mover and the rotation device in a second situation. In an embodiment, in the first situation, the mover is arranged to the move the holder while moving the rotation device, wherein, in the second situation, the mover is arranged to move the holder without moving the rotation device. In an embodiment, in the first situation, the rotation device is arranged to the rotate the holder while rotating the mover, wherein, in the second situation, the rotation device is arranged to rotate the holder without rotating the mover. In an embodiment, the coupling device is arranged to couple the holder and the rotation device to each other in the first situation and to decouple the holder and the rotation device in the second situation. In an embodiment, the coupling device comprises a first part, a second part and an actuator, wherein the first part has a first contact area, wherein the second part has a second contact area, wherein the coupling device is arranged to couple the first contact area and the second contact area in the first situation, wherein the actuator is arranged to separate the first contact area and the second contact area in the second situation. In an embodiment, the actuator comprises a gas nozzle, wherein the gas nozzle is arranged to provide a gas to separate the first contact area and the second contact area in the second situation. In an embodiment, the coupling device comprises a flexible element, wherein the first part and the second part are connected to each other via the flexible element, wherein the flexible element is flexible in a direction in the plane. In an embodiment, the rotation device is arranged to rotate the holder at least 360°. In an embodiment, the holder comprises a thermal conditioning device for conditioning a temperature of the substrate. In an embodiment, the substrate handling system comprises a sensor arranged to provide a signal representative of a position of a center of the substrate relative to a reference element. In an embodiment, the substrate handling system comprises a controller arranged to control a movement of the mover and a rotation of the rotation device based on the signal. In an embodiment, the controller is arranged to determine an offset between the center of the substrate and the reference element based on the signal. In an embodiment, the controller is arranged to change the offset by controlling the movement of the mover and the rotation of the rotation device. In an embodiment, the reference element comprises a docking device, wherein the docking device is arranged to dock with a robot arranged to load the substrate onto or to unload the substrate from the holder while the robot is docked with the docking device. In an embodiment, the substrate handling system comprises the robot. In an embodiment, the substrate handling system comprises a further sensor for providing a sensor signal representative of a position of the mover relative to the reference element. In an embodiment, the substrate handling system comprises a lifting pin arranged to lift the substrate from the holder, wherein the lifting pin comprises a flexible tip arranged to contact the substrate. In an embodiment, the flexible tip is rotatably flexible along an axis in the plane.

In an embodiment, there is provided a lithographic apparatus comprising a substrate handling system as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate W and develops the exposed resist), a metrology tool and/or an inspection tool. Further, the substrate W may be processed more than once, for example in order to create a multi-layer IC, so that the term substrate W used herein may also refer to a substrate W that already contains multiple processed layers.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A substrate handling system for handling a substrate, the substrate handling system comprising:
   a holder configured to hold the substrate;
   a rotation device configured to rotate the holder around an axis perpendicular to a plane;
   a mover configured to move the holder along a path in the plane relative to the axis; and
   a coupling device configured to couple the holder to the rotation device in a first situation, and to decouple the holder from the rotation device in a second situation,
   wherein, in the first situation, the mover is arranged to move the holder while moving the rotation device, and
   wherein, in the second situation, the mover is arranged to move the holder without moving the rotation device.

2. The substrate handling system of claim 1, wherein the coupling device comprises a first part, a second part and an actuator, wherein the first part has a first contact area, wherein the second part has a second contact area, wherein the coupling device is arranged to couple the first contact area and the second contact area in the first situation, and wherein the actuator is arranged to separate the first contact area and the second contact area in the second situation.

3. The substrate handling system of claim 2, wherein the actuator comprises a gas nozzle, wherein the gas nozzle is arranged to provide a gas to separate the first contact area and the second contact area in the second situation.

4. The substrate handling system of claim 2, wherein the coupling device comprises a flexible element, wherein the first part and the second part are connected to each other via the flexible element, and wherein the flexible element is flexible in a direction in the plane.

5. The substrate handling system of claim 1, wherein the rotation device is arranged to rotate the holder at least 360°.

6. The substrate handling system of claim 1, wherein the holder comprises a thermal conditioning device configured to condition a temperature of the substrate.

7. The substrate handling system of claim 1, further comprising a sensor arranged to provide a signal representative of a position of a center of the substrate relative to a reference element.

8. The substrate handling system of claim 7, comprising a controller arranged to control a movement of the mover and/or a rotation of the rotation device based on the signal.

9. The substrate handling system of claim 8, wherein the controller is arranged to determine an offset between the center of the substrate and the reference element based on the signal.

10. The substrate handling system of claim 9, wherein the controller is arranged to change the offset by controlling the movement of the mover and/or the rotation of the rotation device.

11. The substrate handling system of claim 7, wherein the reference element comprises a docking device, wherein the docking device is arranged to dock with a robot arranged to load the substrate onto, or to unload the substrate from, the holder while the robot is docked with the docking device.

12. The substrate handling system of claim 11, comprising the robot.

13. The substrate handling system of claim 7, comprising a further sensor configured to provide a sensor signal representative of a position of the mover relative to the reference element.

14. The substrate handling system of claim 1, further comprising a lifting pin arranged to lift the substrate from the holder, wherein the lifting pin comprises a flexible tip arranged to contact the substrate.

15. The substrate handling system of claim 14, wherein the flexible tip is rotatably flexible along an axis in the plane.

16. A lithographic apparatus comprising the substrate handling system of claim 1.

17. A method, comprising:
   using a holder to support a substrate;
   rotating the holder around an axis perpendicular to a plane using a rotation device;
   moving the holder along a path in the plane relative to the axis using a mover;
   coupling the holder to the rotation device in a first situation, wherein, in the first situation, the mover is arranged to move the holder while moving the rotation device; and
   decoupling the holder from the rotation device in a second situation,
   wherein, in the second situation, the mover is arranged to move the holder without moving the rotation device.

18. A substrate handling system for handling a substrate, the substrate handling system comprising:
   a holder configured to hold the substrate;
   a rotation device configured to rotate the holder around an axis perpendicular to a plane;
   a mover configured to move the holder along a path in the plane relative to the axis; and
   a coupling device configured to couple the holder to the mover in a first situation, and to decouple the holder from the mover in a second situation,
   wherein, in the first situation, the rotation device is arranged to the rotate the holder while rotating the mover, and
   wherein, in the second situation, the rotation device is arranged to rotate the holder without rotating the mover.

19. The substrate handling system of claim 18, wherein the coupling device comprises a first part, a second part and an actuator, wherein the first part has a first contact area, wherein the second part has a second contact area, wherein the coupling device is arranged to couple the first contact area and the second contact area in the first situation, and wherein the actuator is arranged to separate the first contact area and the second contact area in the second situation.

20. The substrate handling system of claim 18, wherein the holder comprises a thermal conditioning device configured to condition a temperature of the substrate.

* * * * *